United States Patent
Cros et al.

(10) Patent No.: US 10,102,956 B2
(45) Date of Patent: Oct. 16, 2018

(54) SKYRMION GENERATION SYSTEM

(71) Applicants: THALES, Courbevoie (FR); CENTRE NATIONAL DE LA RECHERCHE SCIENTIFIQUE, Paris (FR)

(72) Inventors: Vincent Cros, Palaiseau (FR); Noah Van Horne, Palaiseau (FR); Joao Sampaio, Palaiseau (FR); Albert Fert, Palaiseau (FR); Nicolas Reyren, Palaiseau (FR)

(73) Assignees: THALES, Courbevoie (FR); CENTRE NATIONAL DE LA RECHERCHE SCIENTIFIQUE, Paris (FR)

(*) Notice: Subject to any disclaimer, the term of this patent is extended or adjusted under 35 U.S.C. 154(b) by 33 days.

(21) Appl. No.: 15/508,982

(22) PCT Filed: Sep. 9, 2015

(86) PCT No.: PCT/EP2015/070657
§ 371 (c)(1),
(2) Date: Mar. 6, 2017

(87) PCT Pub. No.: WO2016/038113
PCT Pub. Date: Mar. 17, 2016

(65) Prior Publication Data
US 2017/0256351 A1    Sep. 7, 2017

(30) Foreign Application Priority Data
Sep. 9, 2014   (FR) ...................................... 14 02021

(51) Int. Cl.
*H01F 10/32*   (2006.01)
*H01L 43/02*   (2006.01)
(Continued)

(52) U.S. Cl.
CPC .......... *H01F 10/324* (2013.01); *G11C 11/161* (2013.01); *G11C 11/1675* (2013.01);
(Continued)

(58) Field of Classification Search
CPC .............................. H01F 10/32; H01F 10/324
See application file for complete search history.

(56) References Cited

U.S. PATENT DOCUMENTS 9,653,136 B2 *   5/2017   Cros ................... G11C 11/1675
9,773,540 B2 *   9/2017   Zang .................. G11C 11/1675

FOREIGN PATENT DOCUMENTS

JP   2014-086470 A   5/2014

OTHER PUBLICATIONS

Junichi et al., "Current-induced skyrmion dynamics in constricted geometries", Nature Nanotechnology, published online Sep. 8, 2013, pp. 742-747, vol. 8, No. 10.
(Continued)

*Primary Examiner* — Hai L Nguyen
(74) *Attorney, Agent, or Firm* — Young & Thompson (57) ABSTRACT

Disclosed is a system (10) for generating skyrmions, including: a gun (12) including a wall-forming region (14) made from a first material, the region (14) defining an outer space (16) made from a second material different from the first material and an inner space (18) made from a third material different from the first material, the second material and the third material being magnetic materials; and a magnetization reversal device (26) that can reverse the magnetization at the interface between the region (14) and the inner space (18).

10 Claims, 8 Drawing Sheets

(51) Int. Cl.
*H01L 43/10* (2006.01)
*H01L 43/08* (2006.01)
*G11C 11/16* (2006.01)

(52) U.S. Cl.
CPC .............. *H01L 43/02* (2013.01); *H01L 43/08* (2013.01); *H01L 43/10* (2013.01)

(56) References Cited

OTHER PUBLICATIONS

Youngbin et al., "Skyrmion generation by current", Physical Review B, published May 2012, vol. 85, No. 17.
International Search Report, dated Nov. 19, 2015, from corresponding PCT application.

* cited by examiner

SKYRMION GENERATION SYSTEM

The present invention relates to a system for generating magnetic skyrmions.

Magnetic skyrmions are used in the field of spintronics. It is recalled that the spintronic field also known as spin electronics, is a field of electronics using the spin of an electron and not only the charge for information processing.

Said magnetic memory systems are mass storage systems for example, shift registers, logic systems and analogue memories e.g. for circuits of neuro-inspired type.

All these memory systems with spintronic element(s) which have the advantage of being non-volatile, compatible with CMOS technology (Complementary Metal Oxide Semiconductor technology for the production of electronic components and, by extension, all components produced with this technology) and resistant to electromagnetic radiation, are based on a spintronic element called a Magnetic Tunnel Junction (MTJ) which is a stack chiefly composed of two thin magnetic layers (a few nanometers) separated by an insulating layer (in the order of one nanometer) or else by a spin valve (SV) wherein all the layers are metallic.

For a spintronic element of binary memory type, the memory bit corresponds to one MTJ (one SV respectively) with sides of a few tens to a few hundred nanometers, the state of which, alternately 0 and 1, is obtained by two possible configurations of the relative direction of magnetisations in the two magnetic layers (Parallel or Antiparallel). Reading of memory state is obtained by measuring the voltage at the terminals of the MTJ through the tunnel magnetoresistance effect known as TMR. Writing of the state is obtained in the most recent element generations (called STT-MRAM) via Spin Transfer Torque (STT) which permits action on the direction of one or more magnetisations and hence modification of their configuration by injecting a spin-polarised current, changing from Parallel to Antiparallel or vice versa, without the need to apply a magnetic field.

In the more complex systems, such as the shift register systems or spintronic memristors, changes of state are based on the controlled displacement of magnetic domain walls. As for the spintronic elements with binary memory, read-out is performed via magnetoresistive effect and write by spin transfer effect which in, these spintronic elements with binary memory, allows displacement of domain walls.

Several technical problems remain to be solved in existing technologies of memory systems with spintronic element(s). First, there is a need to reduce energy consumption associated with data writing. Energy costs have increased with component down-sizing. This increase is related to the necessity to maintain or even increase the efficacy of spin-transfer effects that are used to write data (by reversing the direction of magnetisation) and to the increased influence of natural defects or defects arising from nano-processing which require the injecting of ever stronger current densities to reach non-stochastic write speeds.

It is also desirable, whilst reducing electrical consumption (used for the different memory functions) to maintain sufficient intensity of measured signal for good detection of memory state.

Secondly, the density of the information able to be stored in non-volatile spintronic memories needs to be increased, which could be achieved either by increasing the integration level (i.e. reduction of the size of an individual bit) or by moving beyond the architectures of standard memories which are binary.

One solution is to provide multi-state memories, also known as multi-level memories. However, in existing magnetic memories, switching between two different directions of uniform magnetisations only allows the coding of a single bit per memory element. The existence of multi-state memories would allow a strong increase in storage density and a reduction in the cost thereof.

To achieve this, it is desirable to use magnetic skyrmions. Magnetic skyrmions are chiral spin structures (i.e. asymmetric relative to an inversion of mirror type) having non-trivial topology and possibly of exceedingly small size (down to a few unit cells) and the direction of rotation between spins is imposed. The configuration of these spin structures may be of «hedgehog» type (cf. FIG. 1 where the arrows indicate the orientation of the spins organised into concentric circles r1, r2, r3, r4 and r5)) or «vortex» type (cf. FIG. 2 where the arrows indicate the orientation of the spins organised into concentric circles R1, R2, R3, R4 and R5).

Such chiral magnetic structures have been predicted and observed in crystals such as MnSi, FeCoSi or FeGe having a crystalline structure with broken inversion symmetry which allows the occurrence of a magnetic interaction known as Dzyaloshinskii-Moriya (DM) and characterized by a parameter called D, giving rise to stabilisation of magnetic configurations of skyrmion type. In magnetic thin film systems, inversion symmetry breaking, allowing stabilisation of a chiral magnetic structure, is induced by the presence of an interface between a thin magnetic film and a thin film with strong spin-orbit coupling (SOC, or spin-orbit interaction), which generates a strong DM interaction giving rise to stabilisation of magnetic configurations of skyrmion type.

It is recalled that SOC describes interactions between the spin of a particle (an electron in our case) and its motion, and it is of particular importance in magnetism, particularly in spintronics, to explain a certain number of fundamental properties of materials such as magnetic anisotropies, magnetoresistive effects or magnetisation decay processes for example.

It will be noted that skyrmions are topologically protected and hence relatively stable against variations in external parameters; they cannot be transformed (once stabilised) to transit towards another magnetic order (e.g. quasi-uniform or vortex). As previously indicated, magnetic skyrmions were only observed in 2009 in systems of single-crystal type (MnSi, FeCoSi, FeGe . . . ) lacking inversion symmetry related to the crystalline structure. These so-called bulk systems cannot have their thickness strongly reduced (in the order of a few tens of nanometers), are not compatible with CMOS technologies and, above all, only have the phase comprising ultra-dense skyrmion lattices at low temperature and under a magnetic field.

Figure 1:
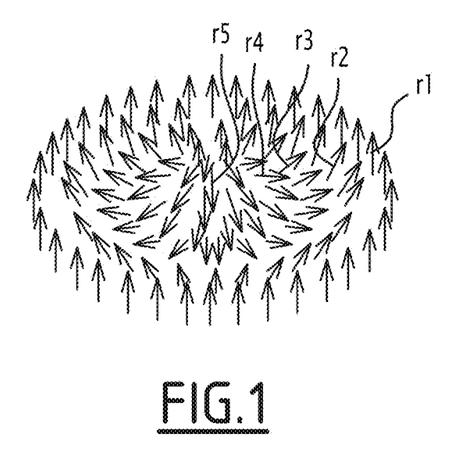
FIG. 1, a view of one type of skyrmion structure.
Figure 2:
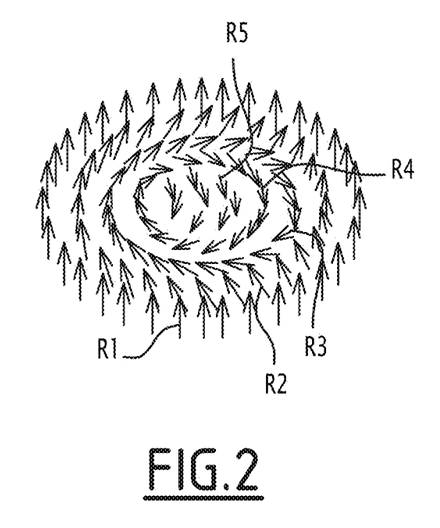
FIG. 2, a view of another type of skyrmion structure.

In addition to the spin-orbit interaction, other types of magnetic interaction e.g. dipolar interactions can allow stabilisation of magnetic configurations of skyrmion type within nanostructures that are then called magnetic bubbles which, in magnetic thin film systems, may have a hedgehog spin structure such as illustrated in FIG. 1. In this document, and in particular in the description and following claims, the spin structures schematised in FIGS. 1 and 2 are grouped together under the general designation of magnetic skyrmion.

It is therefore desirable to be able to generate skyrmions in controlled and efficient manner.

However, this is not sufficient since, for the proper functioning of skyrmion-based systems, it is necessary to be able to control the topological number and chirality of the skyrmions because these parameters directly determine a set of skyrmion properties, e.g. their direction of displacement under a current but also their response to external radiofrequency excitations.

There is therefore a need for a system to generate skyrmions allowing the generation of skyrmions with determined topology and chirality.

For this purpose, a skyrmion generation system is proposed comprising a gun having a wall-forming region made in a first material, the region delimiting an external space made in a second material different from the first material and an inner space made in a third material differing from the first material, the second material and third material being magnetic materials, the region comprising a bottom wall and a side wall connected to the bottom wall at a junction zone. The gun also comprises a half-bubble creation zone capable of generating half-bubbles, the creation zone being contained in the inner space. The creation zone comprises at least one of the two following elements: one or more wall defects and part of the junction zone. The gun also comprises a half-bubble treatment zone comprising an outlet in communication with the outer space, the outlet being capable of converting the half-bubbles to skyrmions, and a passage for propagation of the half-bubbles, the passage connecting the creation zone to the outlet. The treatment zone is able to limit the contact between the creation zone and the outlet, also being able to convert the half-bubbles to skyrmions. The system also comprises a magnetisation reversal device to reverse magnetisation at the interface between the region and the inner space. The reversal device being selected from the group formed by: a first unit to inject current in a first transverse direction, the first unit being capable of injecting a spin-polarised current at the half-bubble creation zone in a spin-polarisation direction having a nonzero component along a second transverse direction, the first transverse direction and the second transverse direction being perpendicular to a longitudinal direction along which the gun extends; a first unit to inject current in a first transverse direction, the first unit being capable of injecting a spin-polarised current at the half-bubble creation zone in a spin-polarisation direction having a nonzero component along a longitudinal direction along which the gun extends, the first transverse direction being perpendicular to the longitudinal direction; a unit applying an external magnetic field to the half-bubble creation zone; a unit to heat the half-bubble creation zone; and a unit to apply an external electrical field to the half-bubble creation zone.

According to particular embodiments, the generation system comprises one or more of the following characteristics taken alone or in any possible technical combination:

the part of the junction zone is a part in which the angle between the bottom wall and the side wall is 180° or less.

at least one of the second magnetic material and third magnetic material is selected from the group formed by a ferromagnetic layer interfaced with a non-magnetic layer, the ferromagnetic layer comprising at least one material from among Fe, Co or Ni, a single or double ferromagnetic perovskite that is Ti, Cr, Mn, Fe, Co, Mo or Ru-based, a Heusler alloy that is Fe, Co, Ni or Mn-based, a magnetic semiconductor or magnetic alloy comprising a Rare Earth element (e.g. Sm, Gd, Tb or Er), a non-magnetic layer comprising at least one material from among the elements Pt, W, Ir, Re, Ta, Pb, Bi, Rh, Pd, Mo, Cu, Sm, Gd, Tb or Er, said non-magnetic layer being interfaced with a ferromagnetic layer or a stack of ferromagnetic and/or non-magnetic layers, and a magnetic material lacking inversion symmetry;

the device to reverse magnetisation is the first current injection unit, the system further comprising a second unit to inject current in the first transverse direction, the second current injection unit being able to inject a spin-polarised current in the propagation passage in a spin-polarisation direction differing from the direction of spin-polarisation of the current that the first unit is able to inject;

the propagation passage comprises two portions linked by an elbow;

the system is able to generate skyrmions having an extension, the outlet having a geometrical shape of which at least one dimension is greater than the extension of a skyrmion able to be generated by the system;

the system is able to generate skyrmions having an extension, the propagation passage having a width equal to or larger than one half of the extension of a skyrmion that the system is able to generate;

the system is able to generate skyrmions having an extension, the propagation passage having a length equal to or greater than the extension of a skyrmion that the system is able to generate;

the third material has a third exchange length, the width of the side wall being the equal to or larger than the first exchange length if the first material is a magnetic material having a first exchange length; than the spin diffusion length if the first material is a magnetic conducting material; than the characteristic tunnel effect length if the first material is insulating or a vacuum;

the third material has a third exchange length, the creation zone being inscribable in a circle having a radius equal to or smaller than the third exchange length.

Other characteristics and advantages of the invention will become apparent on reading the following description of embodiments of the invention given solely as examples and with reference to the following drawings.

Figure 3:
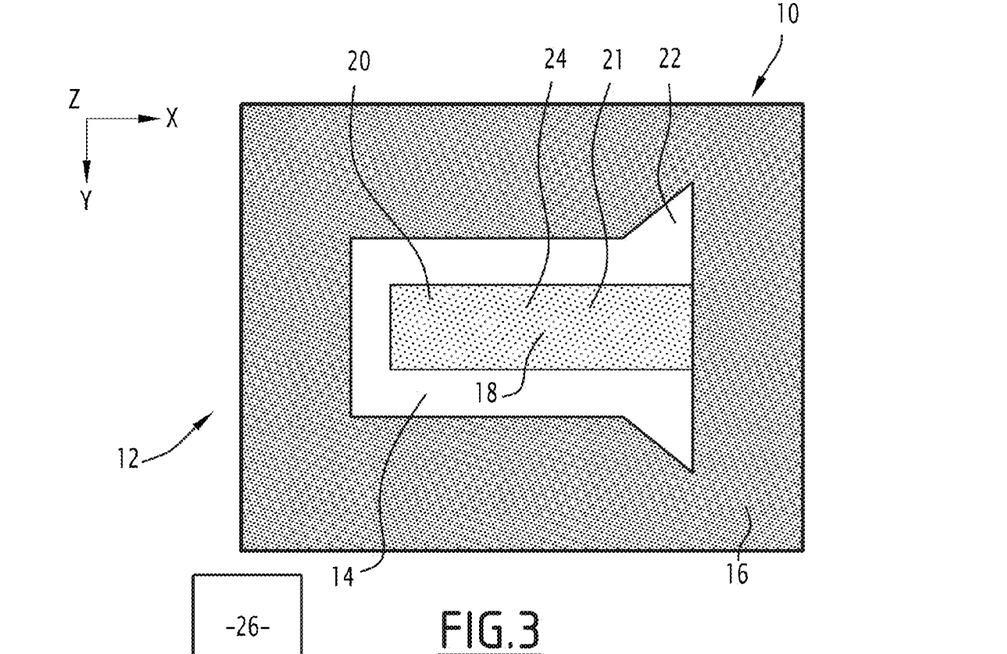
FIG. 3, a schematic overhead view illustrating an example of a skyrmion generation system.

With reference to FIG. 3, there is proposed a system 10 for generating skyrmions.

The generation system 10 is a system capable of generating skyrmions.

The skyrmions that the generation system 10 is able to generate have an extension denoted R in the remainder hereof.

More specifically, in this description, the extension R of a skyrmion is the size of a relaxed skyrmion so that this extension is defined by equation 18 in the article by S. Rohart et al. Phys. Rev. B 88, 184422 (2013) as a function inter alia of parameter D.

The extension R can be measured with magnetic or magnetic-optical imaging techniques. Parameter D entering into the definition of extension R can be obtained from measurement of wall displacement velocities under a field or current for example.

The extension of individual skyrmions, i.e. in finite number, in non-dense lattices is determined by the competition between the different energy terms of the nanostructure (related to exchange interaction and DM interactions) and can reach ultimate dimensions for a magnetic object of a few unit cells (cf. Heinze, S. et al. Nature Phys. 7, 713-718 (2011)).

The generation system 10 comprises a gun 12.

The gun 12 is an elongate element chiefly extending along a longitudinal direction. Two transverse directions perpendicular to the longitudinal direction are also defined, the first transverse direction also being perpendicular to the second transverse direction. The longitudinal direction and the two transverse directions are respectively symbolised by an axis X and two axes Y and Z in FIG. 3.

The gun 12 comprises a wall-forming region 14 made of a first material, the region 14 delimiting an outer space 16 made of a second material M2 and an inner space 18 made of a third material M3. The gun also comprises a half-bubble creation zone 20, a treatment zone 21 comprising an outlet 22 and a propagation passage 24 connecting the creation zone 20 to the outlet 22.

A half-bubble is a magnetic domain having a reversed magnetisation direction relative to the magnetisation direction in the remainder of the inner space 18 and which is in contact with the region 14.

The first material M1 differs from the second material M2. The first material M1 also differs from the third M3.

For example, in one embodiment, the first material M1 is a non-magnetic material.

According to another embodiment, the first material M1 is the ambient medium, the region 14 being particularly obtained by a cut made in a layer forming the outer space 16.

According to another embodiment, the three materials M1, M2 and M3 are magnetic materials. The first material M1 has very different properties from the second material M2 and third material M3.

In said case, this means that the magnetic parameters of the first material M1 differ from the magnetic properties of the second material M2 which themselves may or may not differ from the magnetic parameters of the third material M3. Magnetic anisotropy, material thickness or the presence of broken inversion symmetry are examples of easily modifiable parameters.

According to one embodiment, the wall 14 is produced by etching a magnetic material.

According to another embodiment, the wall 14 is obtained by making a magnetic material non-magnetic.

Figure 6:
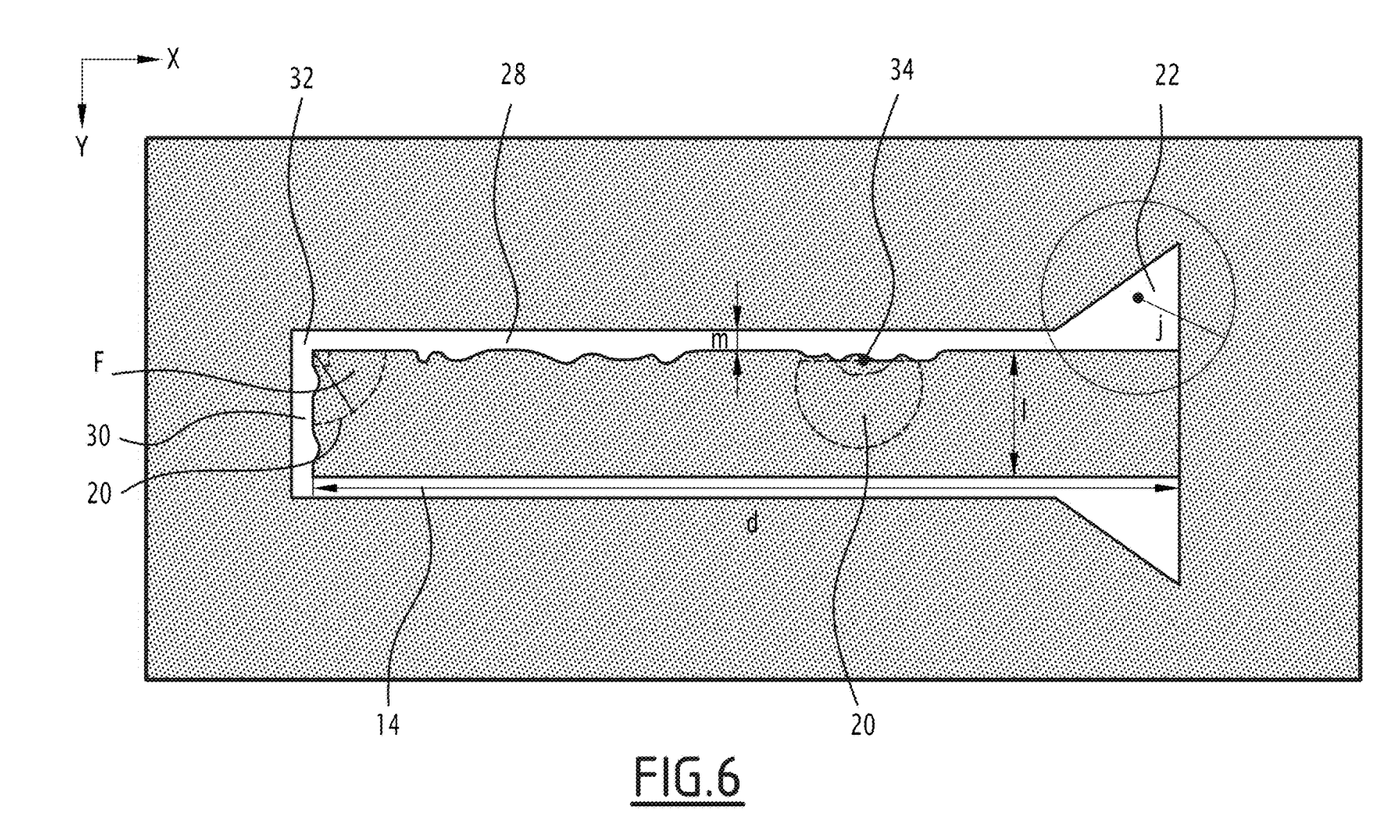
FIG. 6, a schematic overhead view illustrating an example of a skyrmion generation system showing characteristic dimensions.

According to the embodiment illustrated in FIG. 6, the wall 14 comprises a bottom wall 30 and a side wall 28 connected to the bottom wall 30 at a junction zone 32.

The second material M2 in which the outer space 16 is formed is in a magnetic material.

In particular, the second magnetic material M2, according to one embodiment, forms a quasi-two-dimensional hybrid system (since the second material M2 comprises film thicknesses of a few atomic planes that are much smaller than the other dimensions of the system) comprising a nanostructure composed of at least one stack of an ultra-thin layer in ferromagnetic material and a layer of a non-magnetic metal with strong SOC. Typically, the thickness of the layer with strong SOC is between 0.2 nanometers (nm) and 10 nm.

In one embodiment, the ultra-thin magnetic film is replaced by a stack of layers comprising ferromagnetic (and optionally non-ferromagnetic) layers such as Co/Ni/Co/Ni where Co designates cobalt et Ni nickel, but the symmetry breaking at one or more of the interfaces with a strong SOC material is maintained.

For example, according to one embodiment, the second material M2 is a ferromagnetic material interfaced with a non-magnetic layer, the ferromagnetic layer comprising at least one material from among iron (Fe), cobalt (Co) or nickel (Ni), a multilayer with perpendicular magnetisation, a single or double ferromagnetic perovskite that is Ti, Cr, Mn, Fe, Co, Mo or Ru-based, an alloy of Heusler type that is Fe, Co, Ni or Mn-based, a magnetic semiconductor e.g. GaMnAs, organic magnetic layers or a magnetic alloy containing a rare earth element (e.g. Sm, Gd, Tb or Er). It is recalled that an alloy of Heusler type is a ferromagnetic metal alloy based on a Heusler phase: an intermetallic phase of particular composition, having a face-centred cubic crystal structure.

Typically, the thickness of the ferromagnetic layer(s) is a few atomic planes, and is between 0.2 and 3 nm.

According to another embodiment, the second material M2 is a non-magnetic layer comprising at least one material from among the elements Pt, W, Ir, Re, Ta, Pb, Bi, Rh, Pd, Mo, Cu, Sm, Gd, Tb or Er, said non-magnetic layer being interfaced with a ferromagnetic layer or a stack of ferromagnetic and/or non-magnetic layers. Platinum (Pt), tungsten (W), iridium (Ir), rhenium (Re), tantalum (Ta), lead (Pb), bismuth (Bi) are elements in column 5d of the periodic classification of element; rhodium (Rh) and palladium (Pd) belong to column 4d; molybdenum (Mo) and copper (Cu) are elements in column 3d and samarium (Sm), gadolinium (Gd), terbium (Tb) or erbium (Er) belong to the rare earths. It is to be noted that alloys of the preceding elements can also be envisaged, as can stacks e.g. Bi/Ag (Ag representing silver) or Au/Ag where Au represents gold.

According to another embodiment, the second material M2 is a magnetic material lacking inversion symmetry. MnSi, CoFeGe or FeGe are examples of magnetic materials lacking inversion symmetry.

In all the embodiments, the second material M2 of the outer space 16 has a second exchange length A2. For example, the second exchange length A2 is measured by magnetic resonance.

The second material M2 also has a second magnetic anisotropy K2. The second magnetic anisotropy K2 is determined for example via magnetometric measurement.

The third material M3, in which the inner space is formed, is made of a magnetic material.

The same remarks as for the second magnetic material M2 also apply to the third magnetic material M3. These remarks are therefore not repeated in the remainder hereof.

In all the embodiments, the third material M3 of the inner space 18 has a third exchange length A3 if the third material M3 differs from the second material M2. The third exchange length A3 is measured for example by magnetic resonance.

The third material M3 also has a third magnetic anisotropy K3. The third magnetic anisotropy K3 is determined for example by magnetometric measurement.

According to the example in FIG. 6 the width m of the side wall 28, i.e. the dimension of the side wall 28 along the second transverse direction Y, is dependent on the type of the first material M1. If the first material M1 is a magnetic material having a first exchange length, the width m of the side wall 28 is equal to or greater than the first exchange length. If the first material M1 is a magnetic conducting material, the width m of the side wall 28 is equal to or greater than the spin diffusion length. If the first material M1 is insulating or a vacuum, the width m of the side wall 28 is equal to or greater than the characteristic tunnel effect length (typically 1 nm).

According to one embodiment, the second magnetic material M2 and the third magnetic material M3 are the same.

The creation zone 20, also called nucleation zone, is able to generate half-bubbles.

Half-bubbles are also called half-skyrmions by some authors.

The creation zone 20 is contained in the inner space 18.

According to the example of the embodiment illustrated in FIG. 6, the creation zone 20 is a part of the junction zone 20 in which the angle between the bottom wall 30 and the side wall 28 is 90°.

Advantageously, the creation zone 20 is inscribable in a circle having a radius F equal to or smaller than the third exchange length A3 of the third material M3.

According to the embodiment illustrated in FIG. 6, the creation zone 20 also comprises a defect 34 in wall 14. A defect is a protuberance or notch of size equal to or greater than the third exchange length A3 of the third material M3.

The shape of the defects 34 of size equal to or greater than the exchange length A3 is particularly related to the roughness of the edges of the wall 14 during fabrication processes. The shape can be obtained by near-field microscopy or transmission electron microscopy.

The treatment zone 21 is capable of carrying out the transfer, towards outlet 22, of the half-bubbles able to be generated by the creation zone 20, or is capable of storing the half-bubbles able to be generated by the creation zone 20.

In the particular example in FIG. 3, it is the outlet 22 that is able to limit the contact between the region 14 and the half-bubbles that the creation zone 20 is able to generate.

The outlet 22 is in communication with the outer space 16.

The outlet 22 is also capable of converting the half-bubbles to skyrmions.

Figure 4:
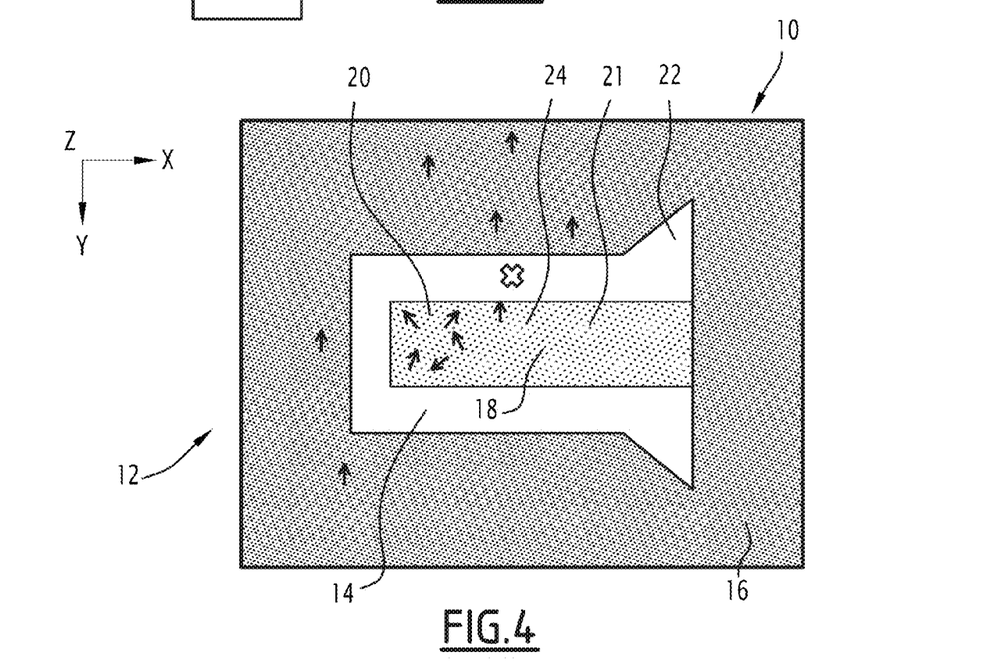
FIG. 4, a schematic overhead view illustrating an example of a skyrmion generation system in operation.

According to the embodiment in FIG. 4, the outlet 22 has a geometric shape at least one dimension of which is greater than the extension R of a skyrmion that the generation system 10 is capable of generating.

The propagation passage 24 connects the creation zone 20 to the outlet 22.

The propagation passage 24 is capable of causing the half-bubbles, generated by the creation zone 20, to propagate towards the outlet 22.

The displacement of a determined number of half-bubbles is obtained via spin-transfer effect e.g. under a geometry of spin-polarised current injection perpendicular to the layers or in the plane of the layer with strong SOC, or else via application of a local electrical field.

Spin-polarisation acting on the half-bubble(s) via spin-transfer effect can be obtained by spin-transfer torques related to the Hall spin effect, via the Rashba effect (transfer torque terms are directly related to spin-orbit effects (SOC) in non-magnetic metal) or more conventionally using a magnetic tunnel junction. The particularity of these spin-transfer terms is that they allow the applying of these torques to cause the half-bubble(s) to move forward into the propagation passage 24.

Given the expected energy advantages for skyrmion propagation systems with perpendicular spin-injection geometry (J. Sampaio et al. Nature Nanotechnology 8, 839, 2013), the system 10 is intrinsically adapted to integration in such systems.

For a propagation passage 24 a few tens of nm in width, half-bubble velocities of a few tens of m/s can be obtained via spin-transfer effect, corresponding to current densities of a few MA/cm$^2$.

It is therefore possible to displace trains of half-bubbles without substantially modifying their size or the distance between neighbouring half-bubbles.

It is additionally to be noted that the shape of the half-bubbles and the displacement of the half-bubbles induced by spin-transfer in the propagation passage 24 still remains possible with a bend in the propagation passage 24.

The propagation passage 24 has a dimension d along the longitudinal direction X called length and a dimension along the second transverse direction Y called width I.

The length d of the propagation passage 24 is equal to or greater than the extension R of a skyrmion able to be generated by the system 10.

The width I of the propagation passage 24 is equal to or greater than one half of the extension R of a skyrmion able to be generated by the system 10.

The generation system 10 also comprises a magnetisation reversal device 26 capable of reversing magnetisation at the interface between the region 14 and the inner space 18.

Figures 7, 8, 9:
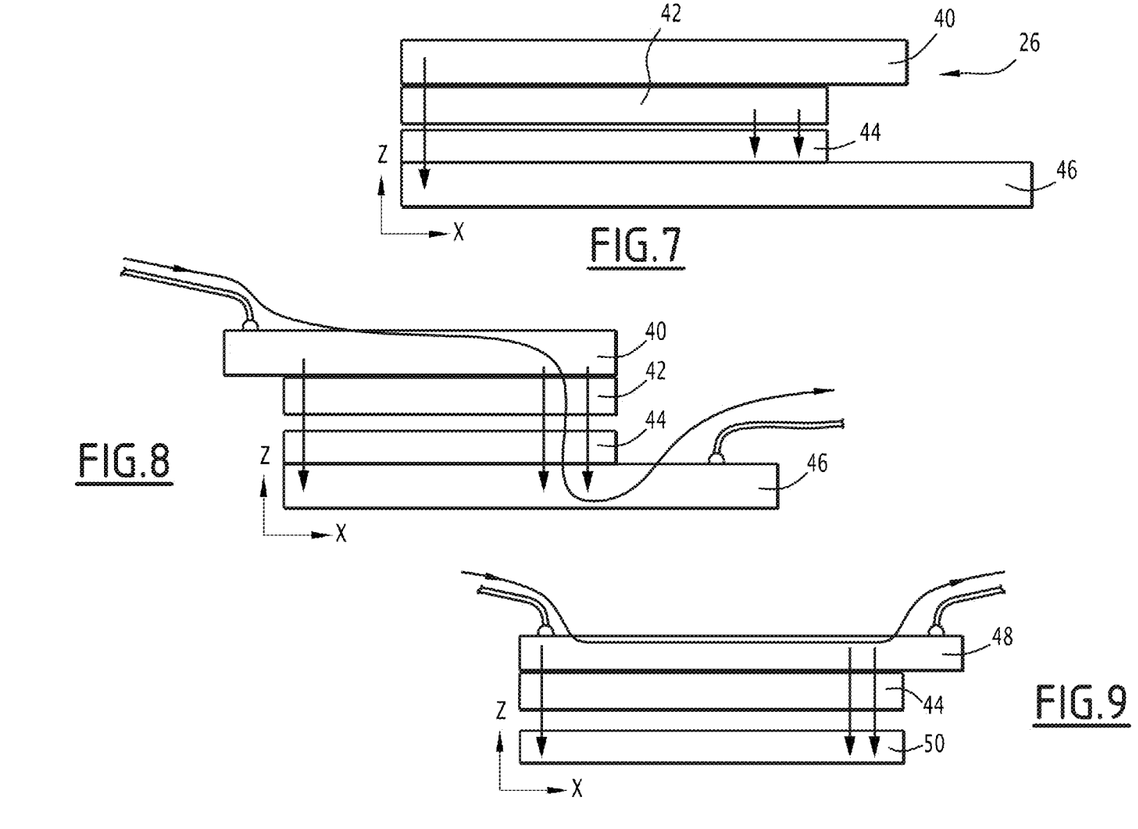
FIG. 7, a schematic side view illustrating an example of a skyrmion generation system.
FIG. 8, a schematic side view illustrating another example of a skyrmion generation system.
FIG. 9, a schematic side view illustrating another example of a skyrmion generation system.

As schematically illustrated in FIG. 7, according to one embodiment, the reversal device 26 is a first unit injecting current in the first transverse direction Z. The first injection unit 26 is capable of injecting a spin-polarised current at the creation zone 20 with a spin-polarisation direction having a nonzero component along a second transverse direction Y.

Said first injection unit 26 is an assembly of three layers for example, such as illustrated in FIG. 7. FIG. 7 shows an assembly of four layers 40, 42, 44, 46 aligned along the first transverse direction Z, one layer 44 corresponding to the system 10 and the other layers 40, 42, 46 corresponding to the first injection unit 26. From top to bottom, the first layer 40 is an upper electrode, the second layer 42 is a spin-polarising layer, the third layer 44 corresponds to the system 10 and the fourth layer 46 is a lower electrode.

Preferably, the other layers 40, 42, 46 corresponding to the first injection unit 26 have the same geometry as the layer 44 corresponding to the system 10.

Another embodiment is illustrated in FIG. 8, the first layer 40 is an upper electrical contact and the fourth layer 46 is a lower electrical contact.

According to another embodiment illustrated in FIG. 9, instead of an assembly of three layers, the first injection unit 26 is an assembly of two layers 48, 50 surrounding the layer 44 corresponding to the system 10. In said configuration, from top to bottom, the first layer 48 is a spin-polarising layer and the second layer 50 is a spin drain. The first layer 48 is therefore a spin-polarising layer which is not necessarily magnetic but has strong spin-orbit coupling allowing the generation of a strong spin-polarised current via Hall spin effect.

The functioning of the generation system 10 will now be described with reference to FIGS. 4 and 5 that are schematic overhead views illustrating an example of a skyrmion generating system in operation.

Injection operates on the basis of destabilisation of magnetisation in the creation zone 20. The extent of said destabilisation of magnetisation in the creation zone 20 is related to the value of the angle between the bottom wall and the side wall. The more the angle between the bottom wall and the side wall is closed the more magnetisation in the creation zone 20 is destabilised and promotes reversal.

In addition, a spin-polarised current is injected under perpendicular geometry.

The nonzero component, along the second transverse direction Y of the spin-polarisation direction of the spin-polarised current injected by the reversal device 26, generates the component of the spin-transfer torque allowing reversal of magnetisation in the creation zone 20.

The nonzero component, along the second transverse direction Y of the spin polarisation direction of the spin-polarised current injected by the reversal device 26, allows displacement of the half-bubble once created into the propagation passage 24 towards the outlet 22.

The injection of polarised current can be performed in different manners.

According to a first embodiment, the current is injected with time variations.

For example, three different current densities are used. The injection of a current at the first current density induces reversal of magnetisation in the creation zone 20. The injection of a current at the second density lower than the first density allows propagation of the formed half-bubble. The injection of a current at the third density stronger than the second density facilitates conversion of the half-bubble to a skyrmion.

According to a second embodiment, the current is injected with spatial variations.

For example, two different current densities are used, a first density for the creation zone 20 and a second density for the propagation passage 24.

According to a third embodiment, the current is injected with variations in the direction of spin-polarisation. The third embodiment can be combined with the first and/or second preceding embodiments.

Finally, the outlet 22 allows controlled detachment of the half-bubbles and the formation of magnetic skyrmions of non-trivial topology. Since the orientation of the magnetic moments in the walls of the half-bubbles (their chirality) is determined by the spin-polarisation of the injected current and magnetisation of the system, all the formed bubbles are skyrmions having a well-determined topological number: either S=1, or S=−1 (but never a mixture of both). This ensures that all the skyrmions created by the system 10 behave identically.

The description of the functioning of the system 10 shows that the system 10 has multiple analogies with phenomena of microfluidics. As examples, three analogies of interest are set out below.

The first analogy concerns the surface energy of magnetic bubbles. As with fluidic bubbles, the free energy of magnetic bubbles is minimised with a maximum surface area to volume ratio (or surface area to circumference). This is responsible for the predictable, gentle closing of the magnetic bubble when leaving the treatment zone 21, since relaxation towards a circular configuration induces separation of the rear part of the bubble from the fluidic outlet.

The second analogy relates to the phenomenon of «wetting». At the outlet of a micro-fluidic channel, the affinity between the transported fluid and the injector may prevent detachment of the liquid bubbles. Said phenomenon is found in the form of a meniscus on the walls of a glass of water. Simulations indicate a similar phenomenon in the affinity of half-bubbles for edges. This is the reason why the fluidic outlet has a shape to promote detachment with minimum «magnetic wetting».

The third analogy concerns the variant with time variation of the injected current. As with a micro-fluidic injector, excessive current density in the treatment zone 21 results in the formation of long «plumes» of the reversed phase at the outlet 22 of the treatment zone 21. As a function of the ratio between the current inside the treatment zone 21 and the external current existing outside the gun 12, these «plumes» may either swell locally at the outlet or become long plumes entrained by the external current.

The gun 12 can therefore be qualified as a magnetic skyrmion «magneto-fluidic» gun.

With the system 10, stabilisation of a controlled number of skyrmions is obtained within a nanostructure. The system 10 is reproducible, allows control over the position and moment at which a skyrmion is created and control over the chirality of the skyrmion.

The system 10 allows the formation of magnetic skyrmions having non-trivial topology i.e. of topological number S=1 or S=−1. All the formed bubbles are skyrmions having a well-determined topological number: either S=1, or S=−1 but never a mixture of both.

Reformulated in terms of a write operation, the system 10 allows ensured reproducibility, magnetic purity (no undesired configuration is produced), spatial accuracy, time accuracy, and deterministic nature (once triggered, the write process occurs at a well-defined moment).

With the system 10 it is therefore possible to generate skyrmions in controlled manner.

Said controlled generation opens up the path for utilisation of skyrmions in controlled number, in particular for non-volatile electronic memories and multi-level memories for information storage and reprogrammable magnetic logic.

Also, the utilisation of skyrmions in controlled number offers multiple advantages. In particular, the dimensions of skyrmions (being defined by competitions between different energy terms of the systems under consideration and hence controllable) can reach ultimate limits in the order of a few unit cells (smaller than one nanometer) which brings a response to the issue of increasing the density of stored information.

In addition, the internal structure of skyrmions a priori makes them much less sensitive to structural and/or magnetic defects due for example to nano-processing, and hence facilitates their displacement via spin-transfer effect thereby reducing the operating energy cost of a memory device using skyrmions.

The controlled generation of skyrmions also concerns the field of bio-inspired circuits having regard to memristive properties.

In addition, magnetic skyrmions like other magnetic solitons, are described as particles or pseudo-particles and can therefore be used as oscillator or resonator for highly integrated radiofrequency (RF) systems. For example, among the lowest energy excited modes for a skyrmion, the gyrotropic mode or beat mode having frequencies in the GHz range are examples.

The system 10 additionally has the advantage of being compact since the dimensions of the gun 12 are in the order of the size of the generated skyrmions i.e. a few nanometers to a few tens of nanometers.

Also, the system 10 can be produced using standard electronic lithography and ion etching techniques.

In general, a creation zone 20 is a zone which, via its specific geometry, promotes destabilisation and thereby the local reversal of magnetic spins. The geometry of the creation zone 20 provides control over the magnetic interactions playing a role in the nucleation of skyrmions, such as exchange interaction, asymmetric exchange interaction related to spin-orbit coupling called the Dzyaloshinskii-Moriya (DM) interaction, or dipolar interaction.

In the remainder hereof, for a better understanding of the influence of the geometry of the creation zone 20, the origin and role of each of the aforementioned interactions are recalled.

Exchange interaction tends to produce strong alignment of neighbouring spins (in parallel manner in a ferromagnetic or antiparallel in an antiferromagnetic). For local reversal of magnetisation, it is generally desirable to reverse the magnetisation of some neighbouring atoms. As a result, the reversed magnetisation of one atom having few neighbours requires lower energy than for an atom having more magnetic neighbours. The shape of the creation zone 20 shown in FIGS. 12 and 13 minimises the number of atoms around some regions, in particular the corners of the creation zone 20.

Dipolar interaction tends to align the 'north' pole of a group of atoms with the 'south' pole of a group of neighbouring atoms. Said interaction means that the magnetic atoms either side of the gun 12 radiate a dipolar field acting on the atoms inside the gun 12, tending to reverse their magnetisation. The atoms inside the gun 12 thereby undergo destabilisation that is dependent on the strength of the dipolar field, all the more so as their stabilisation via exchange interaction is largely reduced.

If the magnetic material has low structural symmetry or else a very thin film in contact with a film of material having strong spin-orbit coupling, a third interaction is to be considered: the so-called Dzyaloshinskii-Moriya (DM) interaction. This third interaction, equivalent to an asymmetric exchange interaction, tends to open the angle between neighbouring spins. One consequence of the presence of a DM interaction is that the spins on the edge of magnetic layers are angularly offset from the angle imposed by direct exchange interaction.

The creation zone 20, whether this zone comprises a corner or defect, functions via minimisation of the local exchange interaction, maximisation of the local (dipolar) demagnetising field and by making use of spin-orbit interactions of DM type to enhance and guide local magnetisation reversal.

In this account, as a variant, the angle between the bottom wall and the side wall differs from 90°.

In particular, the angle between the bottom wall and the side walls is 180° or less.

The applicant, with numerical simulations, has verified that optimisation of magnetisation destabilisation in the creation zone 20 via a reduction in the angle between the bottom wall and the side wall can be obtained by reducing the angle between the bottom wall and the side wall provided that the confinement effects, due to drawing the edges closer to one another, do not become predominant (i.e. to the extent of hampering the creation of half-bubbles in the inner space 18).

Figure 12:
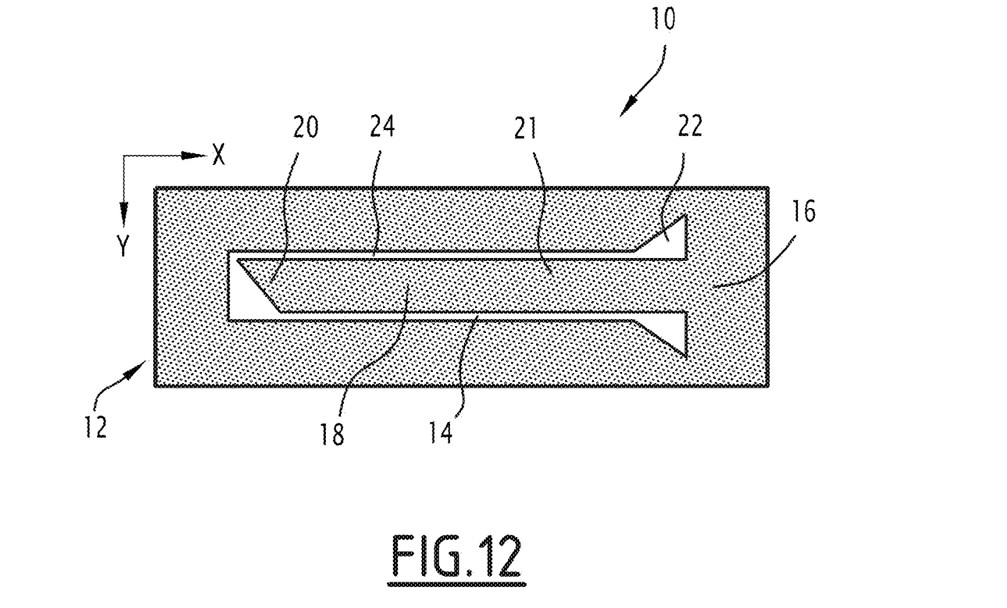
FIG. 12, a schematic overhead view illustrating another example of a skyrmion generation system.

FIG. 12 illustrates a bottom wall shape with triangular cross-section promoting the formation of half-bubbles.

According to another embodiment, the third magnetic material M3 has a chiral DM interaction form, conducive to stabilising skyrmions of the type schematised in FIG. 2. In said embodiment, the first injection unit 26 is capable of injecting a spin-polarised current in the creation zone 20 with a spin-polarisation direction having a nonzero component along direction X.

As a variant, the reversal device 26 is a unit applying an external magnetic field to the creation zone 20. Typically, the magnetic field that the application unit is able to apply is a few tens of milliTesla (mT) to a few hundred mT.

According to another variant, the reversal device 26 is a unit to heat the creation zone 20. For example, the reversal device 26 is a laser source allowing local destabilisation of magnetisation solely at the creation zone 20.

According to another variant, the reversal device 26 comprises a unit capable of applying an electrical field in the creation zone 20.

Other embodiments for the half-bubble treatment zone 21 exist provided that the treatment zone 21 is able to limit the contact between the region and the half-bubbles able to be generated by the creation zone 20.

The formation of skyrmions having determined chirality is strongly influenced by the phenomenon of «magnetic wetting». The treatment zone 21 allows limiting of magnetic wetting and thereby ensures the formation of skyrmions at the outlet 22 of the system 10.

According to the case illustrated in FIG. 10, the magnetisation reversal device 26 is the first current injection unit described with reference to FIG. 5. In addition, the generation system 10 comprises a second unit 50 injecting current in the first transverse direction Z. The second current injection unit 50 is able to inject a spin-polarised current in the propagation passage 24 with a spin-polarisation direction different from the spin-polarisation direction of the current that the first unit 26 is able to inject.

Figures 10, 11:
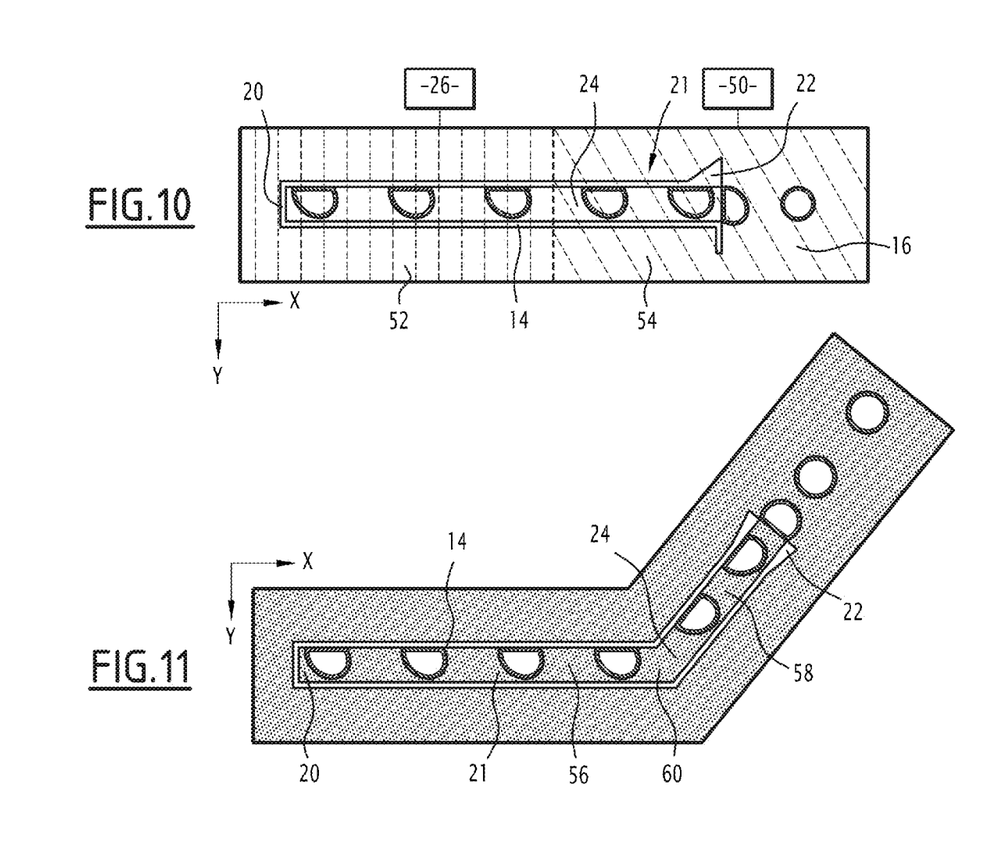
FIG. 10, a schematic overhead view illustrating another example of a skyrmion generation system.
FIG. 11, a schematic overhead view illustrating another example of a skyrmion generation system.

This means that, according to the example in FIG. 10, there are two different portions 52, 54 in the propagation passage 24, the first portion 52 comprising the creation zone 20 and the second portion 54 comprising the outlet 22.

In the first portion 52 the direction of spin-polarisation allows the creation of a half-bubble whilst in the second portion 54, the direction of spin-polarisation is selected so that the half-bubble becomes detached from the gun 12 in the second portion 54 (reduced wetting).

In said case, preferably the outlet 22 is of simpler shape than in the other embodiments since the outlet 22 is no longer compelled to ensure limiting of the contact between the region 14 and the half-bubbles able to be generated by the creation zone 20.

According to the example in FIG. 11, the propagation passage 24 comprises two portions 56, 58 connected by an elbow 60.

According to the example in FIG. 11, the first portion 56 and the second portion 58 are rectilinear.

In addition, the first portion 56 is oriented along the longitudinal direction X whilst the direction along which the second portion 58 extends forms an angle with the longitudinal direction X. In this particular case, the angle between the direction along which the second portion 58 extends and the direction along which the first portion 56 extends is obtuse.

With said geometry of the propagation passage 24, it is possible both to maintain optimal conditions for injection into the creation zone 20 and to allow ejection of the half-bubble not on one of the arms at the outlet of the gun 12 but in the centre of the gun 12.

For this purpose, the angle of the elbow is adapted. The elbow angle is selected as a function of the direction of spin-polarisation of the current injected by the first unit 26.

In such case, the outlet 22 is of simpler shape than in the other embodiments since the outlet 22 is no longer compelled to ensure limiting of the contact between the region 14 and the half-bubbles able to be generated by the creation zone 20.

Additionally, since the «magnetic wetting» observed in simulations conducted by the applicant is partly a function of the angle between the edges concerned and the propagation pathway of the skyrmions, various geometric shapes can be envisaged for the outlet 22. In particular, triangular, shapes, square shapes or rounded shapes.

More specifically, the outlet 22 is formed by two cylinders the base of which has a shape varying in relation to embodiments.

For the case in FIGS. 4, 6, 11 and 12, each cylinder has a triangular base, the outlet 22 being symmetrical.

Figure 5:
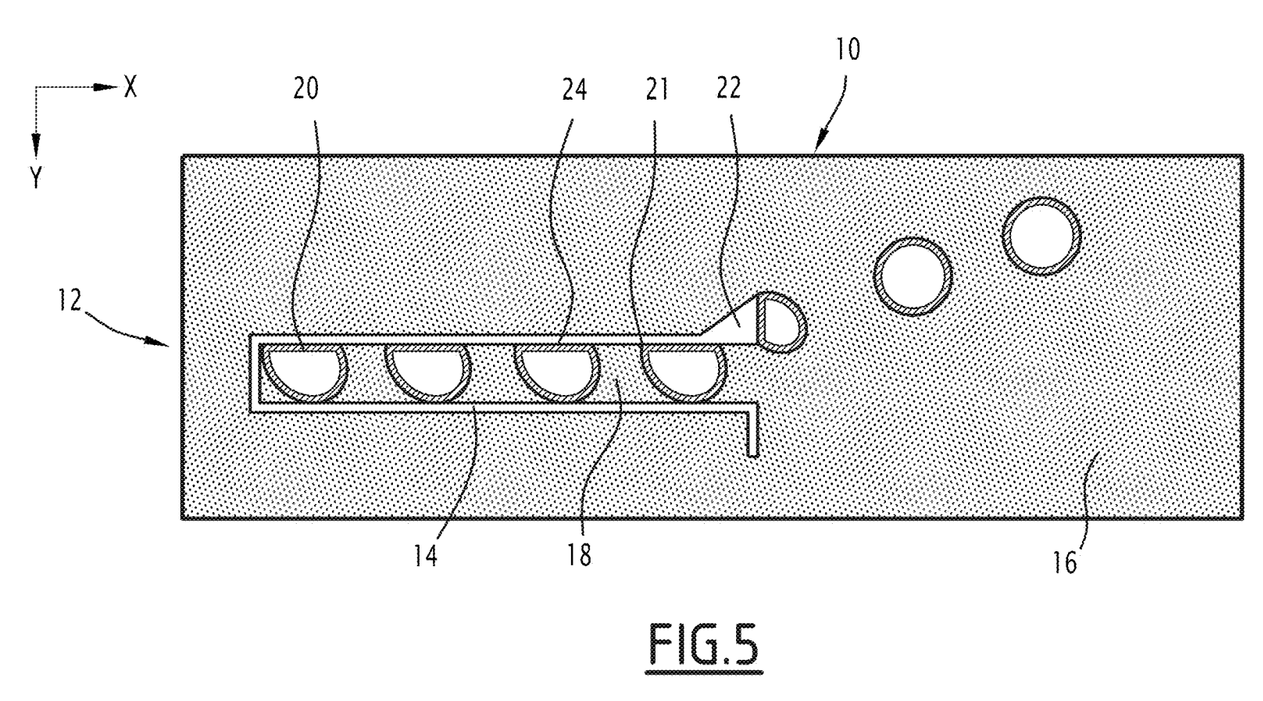
FIG. 5, a schematic overhead view illustrating an example of a skyrmion generation system in operation.

According to the example in FIGS. 5 and 10, one of the two cylinders has a triangular base, the other having a rectangular base.

Figure 13:
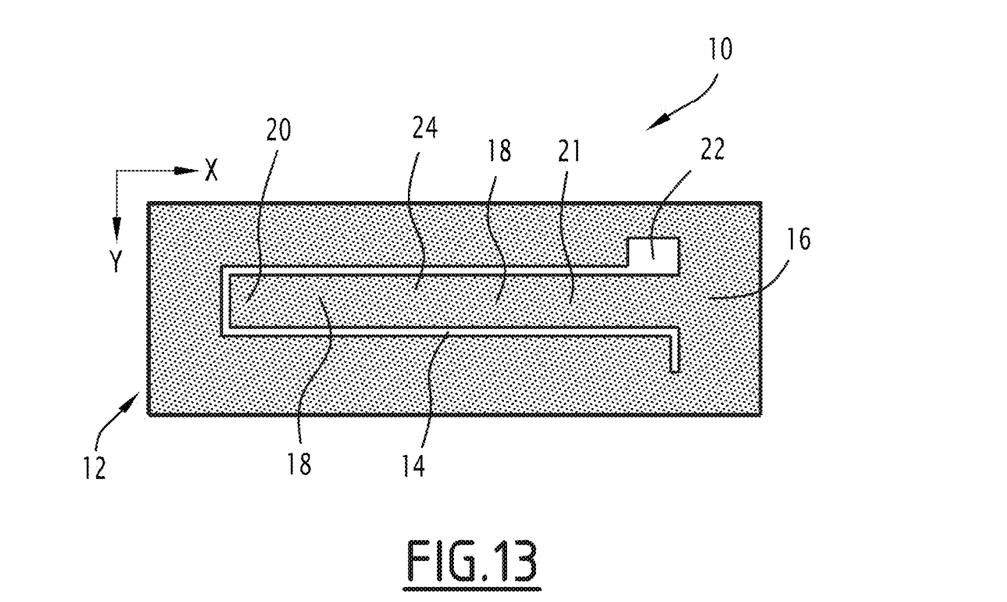
FIG. 13, a schematic overhead view illustrating another example of a skyrmion generation system.

For the case in FIG. 13, each cylinder has a rectangular base, one of the two bases having a cross-section equal to or greater than twice the cross-section of the other base.

Figure 14:
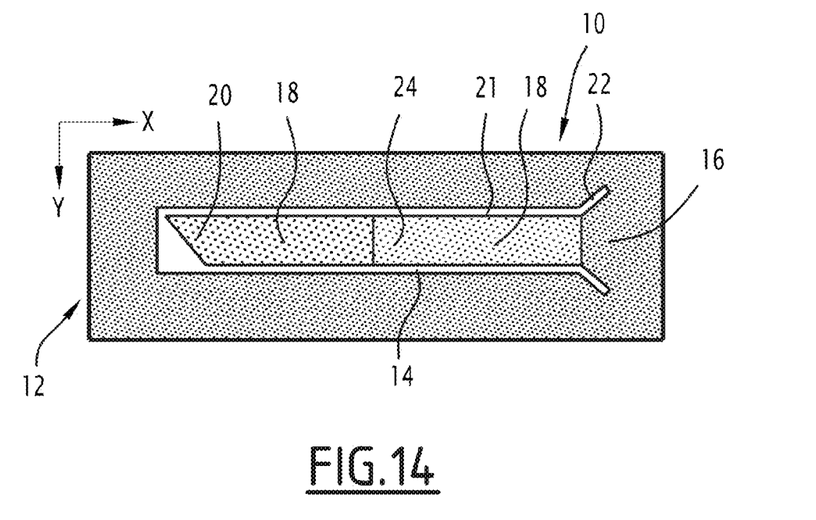
FIG. 14, a schematic overhead view illustrating another example of a skyrmion generation system.

For the case in FIG. 14, each cylinder has one same rectangular base, the cylinders being symmetrical relative to the axis of symmetry of the gun 12.

Figure 15:
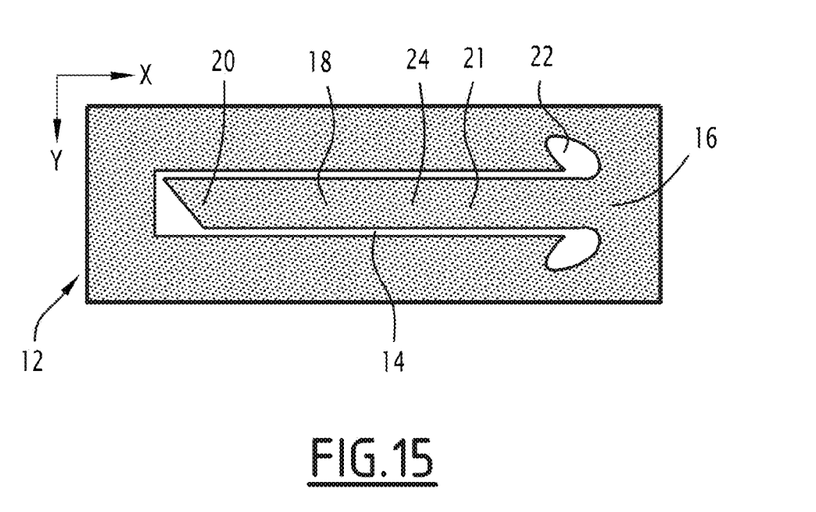
FIG. 15, a schematic overhead view illustrating another example of a skyrmion generation system.

For the case in FIG. 15, each cylinder has one same ovoid base, the cylinders being symmetrical relative to the axis of symmetry of the gun 12.

In all cases, the maximum dimensions of the bases are a few times the dimension R of a skyrmion. Typically, each dimension is equal to or smaller than three times the dimension R of a skyrmion.

The functioning modes and embodiments described above are able to be combined with one another in full or in part to give rise to other embodiments of the invention.

The invention claimed is:

1. A system to generate skyrmions, comprising:
   a gun having:
      a wall-forming region made of a first material, the region delimiting an outer space made of a second material differing from the first material and an inner space made of a third material differing from the first material, the second material and the third material being magnetic materials, the region comprising a bottom wall and a side wall connected to the bottom wall at a junction zone,
   a half-bubble creation zone capable of generating half-bubbles, the creation zone being in the inner space, the creation zone comprising at least one of the following two elements:
      one or more defects of the wall; and
      part of the junction zone; and
   a half-bubble treatment zone comprising:
      an outlet in communication with the outer space, the outlet being capable of converting the half-bubbles to skyrmions, and
      a half-bubble propagation passage, the passage connecting the creation zone to the outlet,
   the treatment zone being able to limit the contact between the creation zone and the outlet also being able to convert the half-bubbles to skyrmions; and
   a magnetisation reversal device able to reverse magnetisation at the interface between the region and the inner space, the reversal device being selected from the group formed by:
      a first unit to inject current in a first transverse direction, the first unit being capable of injecting a spin-polarised current in the half-bubble creation zone with a spin-polarisation direction having a nonzero component along a second transverse direction, the first transverse direction and the second transverse direction being perpendicular to a longitudinal direction along which the gun extends;
      a first unit to inject current in a first transverse direction, the first unit being capable of injecting a spin-polarised current in the half-bubble creation zone with a spin-polarisation direction having a nonzero component along a longitudinal direction along which the gun extends, the first transverse direction being perpendicular to the longitudinal direction;
      a unit to apply an external magnetic field to the half-bubble creation zone;
      a unit to heat the half-bubble creation zone; and
      a unit to apply an external electrical field to the half-bubble creation zone.

2. The system according to claim 1, wherein the part of the junction zone is a part in which the angle between the bottom wall and the side wall is 180° or less.

3. The system according to claim 1, wherein at least one of the second magnetic material or third magnetic material is selected from the group formed by:
   a ferromagnetic layer interfaced with a non-magnetic layer, the ferromagnetic layer comprising at least one material from among Fe, Co or Ni, a single or double ferromagnetic perovskite that is Ti, Cr, Mn, Fe, Co, Mo or Ru-based, a Heusler alloy that is Fe, Co, Ni or Mn-based, a magnetic semiconductor, an organic magnetic layer or magnetic layer containing rare earth elements;
   a non-magnetic layer comprising at least one material from among the elements Pt, W, Ir, Re, Ta, Pb, Bi, Rh, Pd, Mo, Cu, Sm, Gd, Tb or Er, said non-magnetic layer being interfaced with a ferromagnetic layer or a stack of ferromagnetic and/or non-magnetic layers; and
   a magnetic material lacking inversion symmetry.

4. The system according to claim 3, wherein the magnetisation reversal device is the first current injection unit, the system additionally comprising a second current injection unit in the first transverse direction, the second current injection unit being capable of injecting a spin-polarised current in the propagation passage with a spin-polarisation direction differing from the spin-polarisation direction of the current that the first unit is able to inject.

5. The system according to claim 1, wherein the propagation passage comprises two portions connected by an elbow.

6. The system according to claim 1, wherein the system is capable of generating skyrmions having an extension, the outlet having a geometric shape of which at least one dimension is greater than the extension of a skyrmion able to be generated by the system.

7. The system according to claim 1, wherein the system is capable of generating skyrmions having an extension, the propagation passage having a width equal to or greater than one half of the extension of a skyrmion able to be generated by the system.

8. The system according to claim 1, wherein the system is capable of generating skyrmions having an extension, the propagation passage having a length equal to greater than the extension of a skyrmion able to be generated by the system.

9. The system according to claim 1, wherein the third material has a third exchange length, the width (m) of the side wall being equal to or greater than:
   the first exchange length, if the first material is a magnetic material having a first exchange length;
   the spin-diffusion length, if the first material is a magnetic conducting material; and
   the characteristic tunnel effect length, if the first material is insulating or a vacuum.

10. The system according to claim 1, wherein the third material has a third exchange length, the creation zone being inscribable in a circle having a radius equal to or smaller than the third exchange length.

* * * * *